US012808931B2

(12) United States Patent
Gonzales et al.

(10) Patent No.: US 12,808,931 B2
(45) Date of Patent: Nov. 24, 2026

(54) EOP PROBING ON MULTI-DIE STACKS

(71) Applicant: Micron Technology, Inc., Boise, ID (US)

(72) Inventors: John M. Gonzales, Boise, ID (US); Seth A. Eichmeyer, Boise, ID (US); Atsuko Otsuka, Hiroshima (JP); Takeshi Kaku, Hiroshima (JP); Soeparto Tandjoeng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 297 days.

(21) Appl. No.: 18/535,640

(22) Filed: Dec. 11, 2023

(65) Prior Publication Data

US 2024/0201252 A1 Jun. 20, 2024

Related U.S. Application Data

(60) Provisional application No. 63/433,862, filed on Dec. 20, 2022.

(51) Int. Cl.
*G01R 31/311* (2006.01)
*H10W 90/20* (2026.01)

(52) U.S. Cl.
CPC ......... *G01R 31/311* (2013.01); *H10W 90/284* (2026.01)

(58) Field of Classification Search
CPC ........................... G01R 31/311; H10W 90/284
See application file for complete search history.

(56) References Cited

U.S. PATENT DOCUMENTS

| | | | | |
|---|---|---|---|---|
| 2004/0257847 A1* | 12/2004 | Matsui | G11C 5/00 365/63 |
| 2013/0087788 A1* | 4/2013 | Nakamura | H10P 74/207 438/15 |

* cited by examiner

*Primary Examiner* — Stephanie E Bloss
*Assistant Examiner* — Michael A Harrison
(74) *Attorney, Agent, or Firm* — Brooks, Cameron & Huebsch, PLLC

(57) ABSTRACT

An example method can include focusing a light source onto a circuit of a first memory die of a plurality of memory dies. A light of the light source can reach the circuit of the memory die and can be reflected back toward a sensor. The method can further include receiving the reflection of light from the circuit at the sensor. The method can further include determining whether the circuit is transferring a particular signal based on the reflected light.

16 Claims, 8 Drawing Sheets

EOP PROBING ON MULTI-DIE STACKS

PRIORITY INFORMATION

This application claims the benefit of U.S. Provisional Application No. 63/433,862, filed on Dec. 20, 2022, the contents of which are incorporated herein by reference.

TECHNICAL FIELD

Embodiments of the disclosure relate generally to memory sub-systems, and more specifically, relate to electro-optical probing (EOP) on multi-die stacks.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
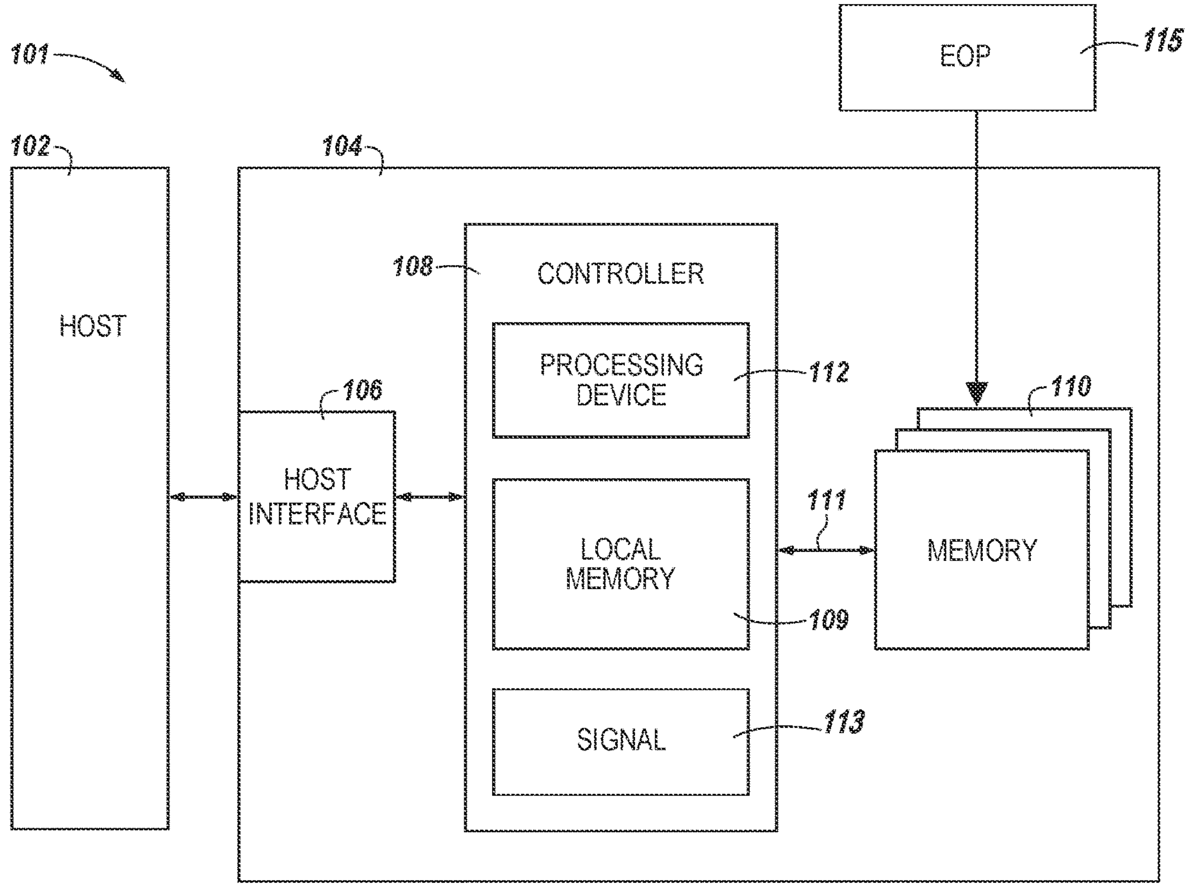
FIG. 1 illustrates an example computing environment that includes a memory sub-system in accordance with some embodiments of the present disclosure.

Aspects of the present disclosure are directed to electro-optical probing of multi-die stacks of a memory system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Accessing signals of transistors within a memory die can detect signal transactions and provide a method to determine if the transistors are working properly. In order to access the signals, electro-optical probing (EOP) can be used. EOP can rapidly measure the operation voltage of a transistor. For example, when a drain voltage of a FET varies by switching operation, the electric field distribution at a drain boundary can also change. This can cause a change of refractive index due to the electro-optical effect of each material. When irradiating a drain by a light beam or light source through the silicon substrate, the intensity of reflected light varies corresponding to the voltage level. The EOP can observe the reflected light which represents a status of the transistor. It will be appreciated that the light source can be an electromagnetic radiation source that can be configured to generate light (e.g., electromagnetic radiation) that is within the visible light spectrum or is outside the visible light spectrum (e.g., x-ray, extreme ultraviolet, near infrared, mid infrared, far infrared, microwave, radio wave, etc.).

EOP can include using a high intensity light (HIL) source focused on a backside of a memory device. In one example, the light frequency of a particular frequency (e.g., 1300 microns) can be used that is transparent to silicon. Further, the reflection of the light off of a depletion zone of the memory dies of the memory device can detect the signal transitions. EOP can also use a solid immersion lens (SIL) to resolve individual memory devices. A SIL lens can have a fixed focal length and the thickness of the memory device substrate can be matched with an SIL lens with a same focal length.

Using EOP through a backside of a multi-die stack allows for an unobstructed view of the transistors without metallization layers blocking the path of the light. However, in some previous approaches, and with a multi-die stack, the memory die closest to the backside may be the only unobstructed transistors. As will be described herein and below, these shortcomings can be resolved by routing metallization layers of lower dies (e.g., memory dies closer to the backside of the multi-die stack) away from a path for the light to take to reach higher dies (e.g., further away from the backside and where the light originates from the light source). In this way, an area devoid of the metallization layers of multiple memory dies can be created and the light from the light source can travel through this devoid area and reach a circuit and/or transistor to assess the signal transitions.

Further, in some previous approaches, a tested diode and/or transistor can interfere with neighboring diodes and/or transistors when reflecting light off the tested diode and/or transistor. For example, the reflection from the neighboring diodes/transistors may interfere with the reflection from the tested diode/transistor (referred to as parasitic capacitance) and cause errors in the analysis. As described herein below, these shortcomings can be avoided by positioning an additional diode and/or transistor further away from a targeted diode/transistor in order to avoid the interference of neighboring diodes/transistors while connecting the additional diode/transistor to the targeted diode/transistor such that their signals are simultaneous and indicate a same signal transition.

As used herein, "a", "an", or "a number of" can refer to one or more of something, and "a plurality of" can refer to two or more such things. For example, a memory device can refer to one or more memory devices, and a plurality of memory devices can refer to two or more memory devices. Further, the figures herein follow a numbering convention in which the first digit or digits correspond to the drawing figure number and the remaining digits identify an element or component in the drawing. Similar elements or components between different figures may be identified by the use of similar digits.

FIG. 1 illustrates an example computing environment 101 that includes a memory sub-system 104 in accordance with some embodiments of the present disclosure. The memory sub-system 104 can include media, such as memory components 110. The memory components 110 can be volatile memory components, non-volatile memory components, or a combination of such. In some embodiments, the memory sub-system is a storage system. An example of a storage system is a SSD. In some embodiments, the memory sub-system 104 is a hybrid memory/storage sub-system. In general, the computing environment 100 can include a host system 102 that uses the memory sub-system 104. For example, the host system 102 can write data to the memory sub-system 104 and read data from the memory sub-system 104.

The host system 102 can be a computing device such as a personal laptop computer, a desktop computer, a digital camera, a mobile telephone, or a memory card reader, among various other types of hosts. The host system 102 can include or be coupled to the memory sub-system 104 (e.g., via a host interface 106) so that the host system 120 can read data from or write data to the memory subsystem 104. As used herein, "coupled to" generally refers to a connection between components, which can be an indirect communicative connection or direct communicative connection (e.g., without intervening components), whether wired or wireless, including connections such as electrical, optical, magnetic, etc. The host interface 106 can be a physical interface, examples of which include, but are not limited to, a serial advanced technology attachment (SATA) interface, a peripheral component interconnect express (PCIe) interface, universal serial bus (USB) interface, Fibre Channel, Serial Attached SCSI (SAS), etc. The host interface 106 can be used to transmit data between the host system 120 and the memory sub-system 104. The host system 102 can further utilize an NVM Express (NVMe) interface to access the memory components 110 when the memory sub-system 104 is coupled with the host system 102 by a PCIe interface. The physical host interface can provide an interface for passing control, address, data, and other signals between the memory sub-system 104 and the host system 102. The memory components 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device can be configured to store 8 KB (kilobytes) of user data per page, 128 pages of user data per block, 2048 blocks per plane, and 16 planes per device. The memory components 110 can also include additionally circuitry (not illustrated), such as control circuitry, buffers, address circuitry, etc.

In operation, data can be written to and/or read from memory (e.g., memory components 110 of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

The memory components 110 can include various combinations of the different types of non-volatile memory components and/or volatile memory components. An example of non-volatile memory components includes a negative-and (NAND) type flash memory. The memory components 110 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 110 can be based on various other types of memory such as a volatile memory. In some embodiments, the memory components 110 can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 110 can be grouped as memory pages or data blocks that can refer to a unit of the memory component used to store data.

As illustrated in FIG. 1, the memory sub-system 104 can include a controller 108 coupled to the host interface 106 and to the memory components 110 via a memory interface 111. The controller 108 can be used to send data between the memory sub-system 104 and the host 102. The memory interface 111 can be one of various interface types compliant with a particular standard such as Open NAND Flash interface (ONFi).

The controller 108 can communicate with the memory components 110 to perform operations such as reading data, writing data, or erasing data at the memory components 110 and other such operations. The controller 108 can include hardware such as one or more integrated circuits and/or discrete components, a buffer memory, or a combination thereof. The controller 108 can be a microcontroller, special purpose logic circuitry (e.g., a field-programmable gate array (FPGA), an application-specific integrated circuit (ASIC), etc.), or other suitable processor. The controller 108 can include a processing device 112 (e.g., processor) configured to execute instructions stored in local memory 109. In the illustrated example, the local memory 109 of the controller 108 includes an embedded memory configured to store instructions for performing various processes, operations, logic flows, and routines that control operation of the memory sub-system 104, including handling communications between the memory sub-system 104 and the host system 102. In some embodiments, the local memory 109 can include memory registers storing memory pointers, fetched data, etc. The local memory 109 can also include read-only memory (ROM) for storing micro-code.

While the example memory sub-system 104 in FIG. 1 has been illustrated as including the controller 108, in another embodiment of the present disclosure, a memory sub-system 104 may not include a controller 108, and can instead rely upon external control (e.g., provided by an external host, such as by a processing device separate from the memory sub-system 104).

The controller 108 can use and/or store various operating parameters associated with operating (e.g., programming and/or reading) the memory cells. Such operating parameters may be referred to as trim values and can include programming pulse magnitude, step size, pulse duration, program verify voltages, read voltages, etc. for various different operating processes. The different processes can include processes to program cells to store different quantities of bits, and different multiple pass programming process types (e.g., 2-pass, 3-pass, etc.). The controller 108 can be responsible for other operations such as wear leveling operations, garbage collection operations, error detection and/or correction (e.g., error-correcting code (ECC)) operations, encryption operations, caching operations, and address translations between a logical block address and a physical block address that are associated with the memory components 110.

The memory sub-system 104 can also include additional circuitry or components that are not illustrated. For instance, the memory components 110 can include control circuitry, address circuitry (e.g., row and column decode circuitry), and/or input/output (I/O) circuitry by which they can communicate with controller 108 and/or host 102. As an example, in some embodiments, the address circuitry can receive an address from the controller 108 and decode the address to access the memory components 110.

In various embodiments, an electro-optical probing (EOP) component 115 can be used to perform an EOP operation on the memory components 110, as will be described further below. The EOP operation can include using a light source to direct light at a particular diode and/or transistor of a memory die of a multi-die stack of memory dies in order to determine a signal transition associated with that particular diode and/or transistor. The light source can be a high intensity light (HIL) source. The light can be directed through a solid immersion lens (SIL) in order to direct the light to a particular location within the multi-die stack. The SIL can have a particular fixed focal length. The thickness of the bulk substrate is matched with an SIL lens with a same focal length, as will be described further below in association with FIGS. 2-4.

In various embodiments, the controller 108 can include a signal component 113 to manage, monitor and/or adjust a signal of a particular diode and/or transistor in order to perform an EOP operation. The signal component 113 can be any number of hardware, firmware, and/or additional circuitry to perform the operations described below. For example, the signal component 113 can determine which signal or signal pattern to perform on the targeted diode and/or transistor and send the data indicating the signal or pattern performed to the EOP component 113 and/or other external components that use the EOP component 113 to perform the EOP operations.

Figure 2:
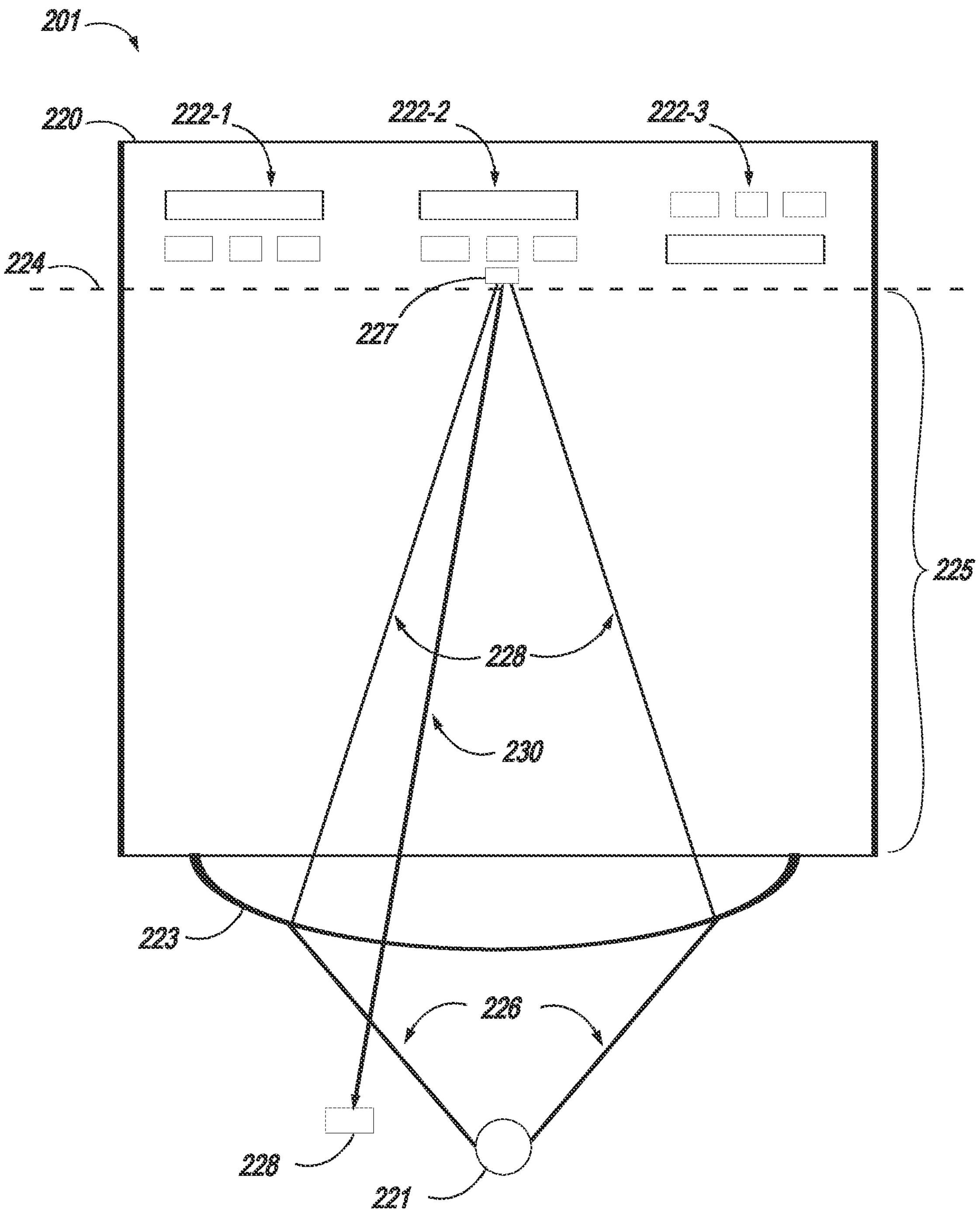
FIG. 2 illustrates an example of an apparatus for electro-optical probing of a plurality of memory dies in accordance with some embodiments of the present disclosure.

FIG. 2 illustrates an example of a system 201 for electro-optical probing of a plurality of memory dies in accordance with some embodiments of the present disclosure. The system 201 can include a memory device 220, a lens 223, and a light source 221. The memory device 220 can include a plurality of memory dies 222-1, 222-2, 222-3. The memory die 222-2 can include a particular diode and/or transistor 227 used as the target diode and/or transistor. The light source 221 can be a high intensity light (HIL) source. The lens 223 can be a solid immersion lens (SIL). The lens 223 can have a particular fixed focal length. The particular focal length of the lens 223 can correspond to a distance 225 that the lens 223 is from the location 224 of the diode and/or transistor 227.

The light source 221 can emit a portion of light 226 that is directed to the lens 223. The light 226 can be focused through the lens 223 to result in a portion of light 228 that is directed to the diode and/or transistor 227. The portion of light 228 can be reflected off the diode and/or transistor 227. The reflected light 230 can be directed to a sensor 228. The EOP operation can detect the intensity of the reflected light 230 caused by the change in the electric field at the drain of the transistor due to a logic operation. This internal operation can be displayed in a waveform similar to an oscilloscope. The EOP can observe the reflected light 230 which represents the status of the transistor.

In some examples, an electro-optical frequency mapping (EOFM) can be used to image active transistors at a specific frequency. The EOFM can refer to a method of extracting specified frequency components from the reflected light using a spectrum analyzer and mapping the transistors operating at that frequency. For EOFM, the reflected light from a drain has a power spectrum distribution. The EOFM can detect the intensity of signal under certain frequency from the distribution and visualize it as an image. By operating transistors in a specific region under certain frequency, it can be possible to observe if the circuits are correctly switching or not.

Figure 3A:
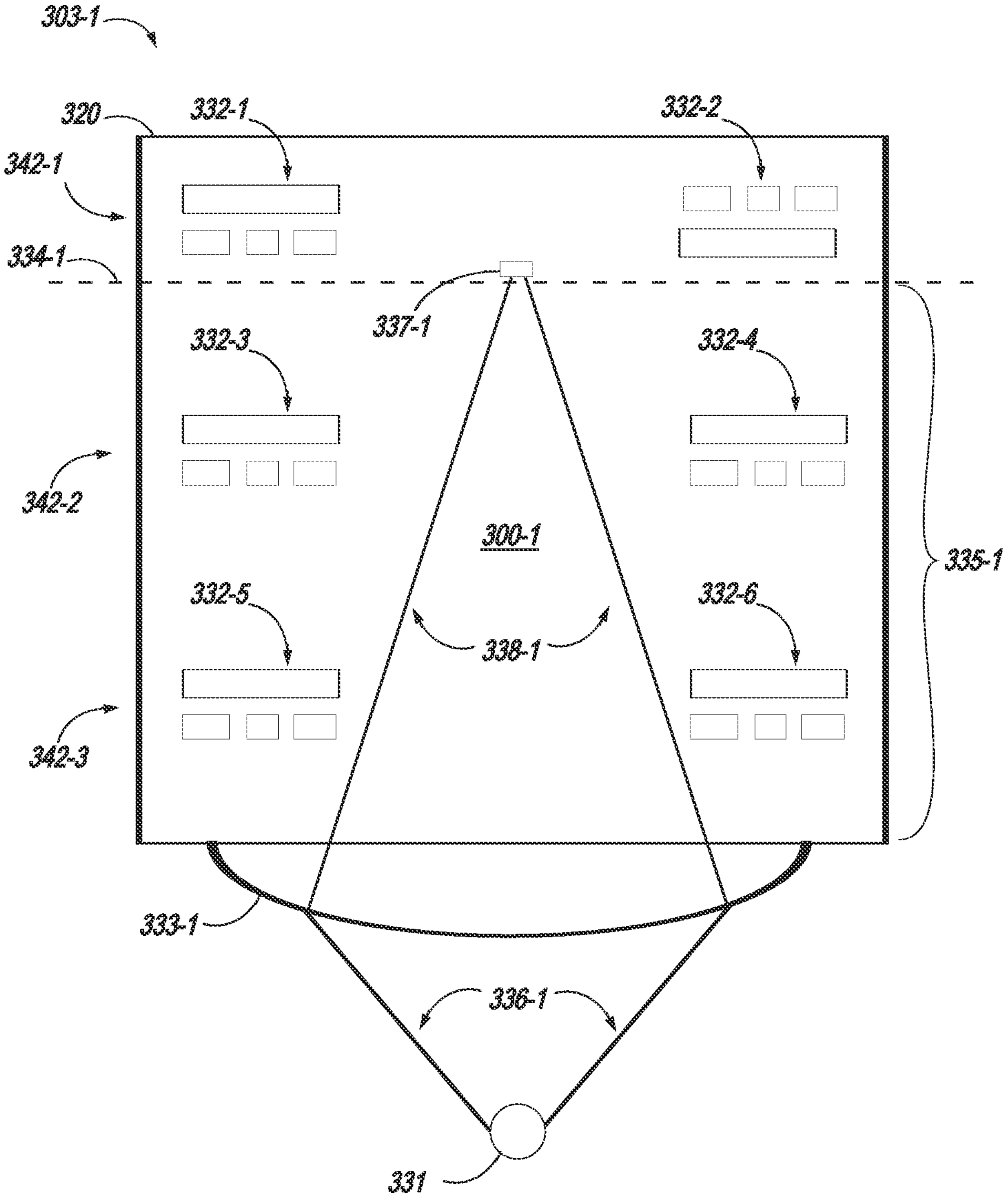
FIGS. 3A-3C each illustrate an example system for performing electro-optical probing of a multi-die stack in accordance with some embodiments of the present disclosure.
Figure 3B:
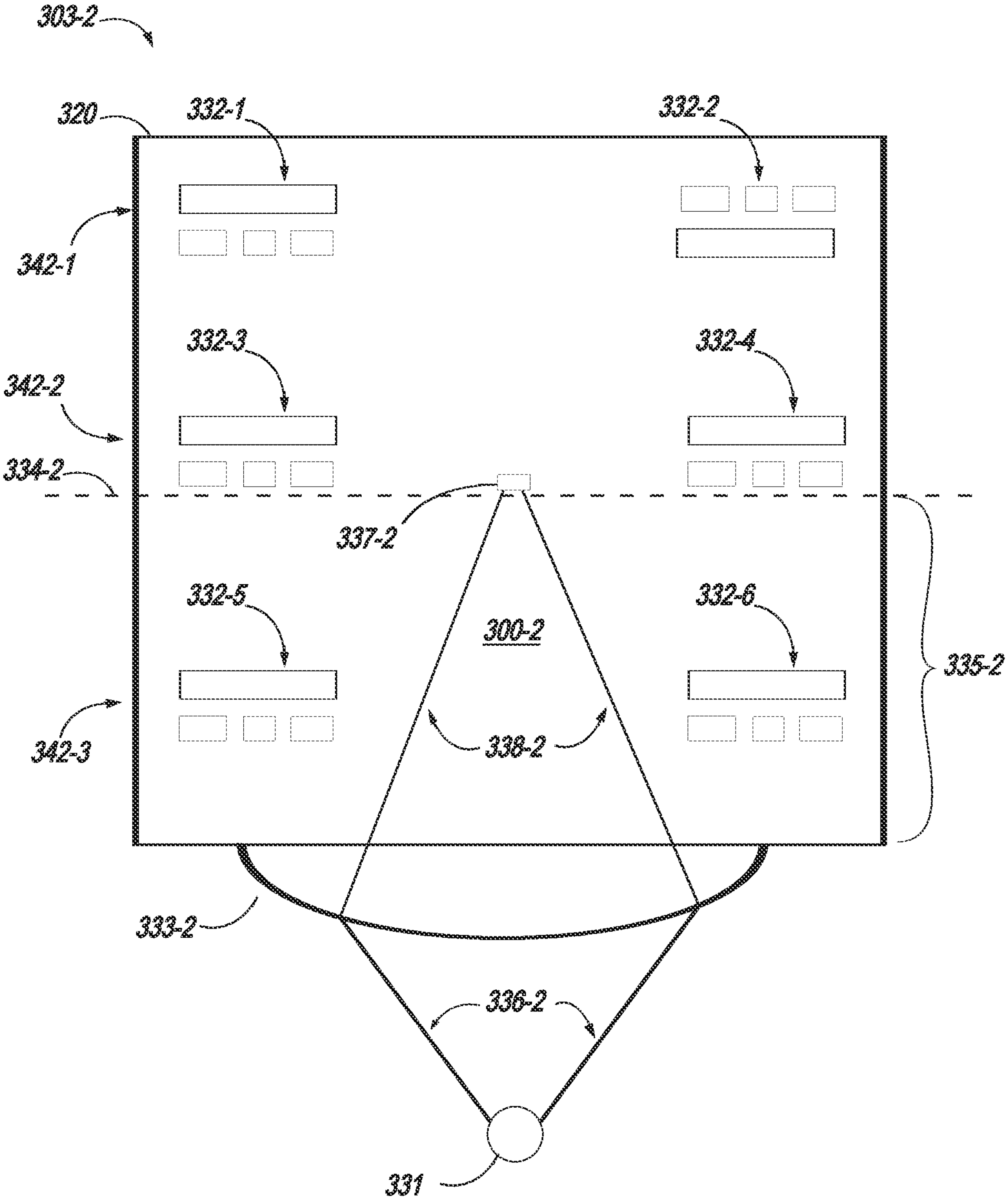
Figure 3C:
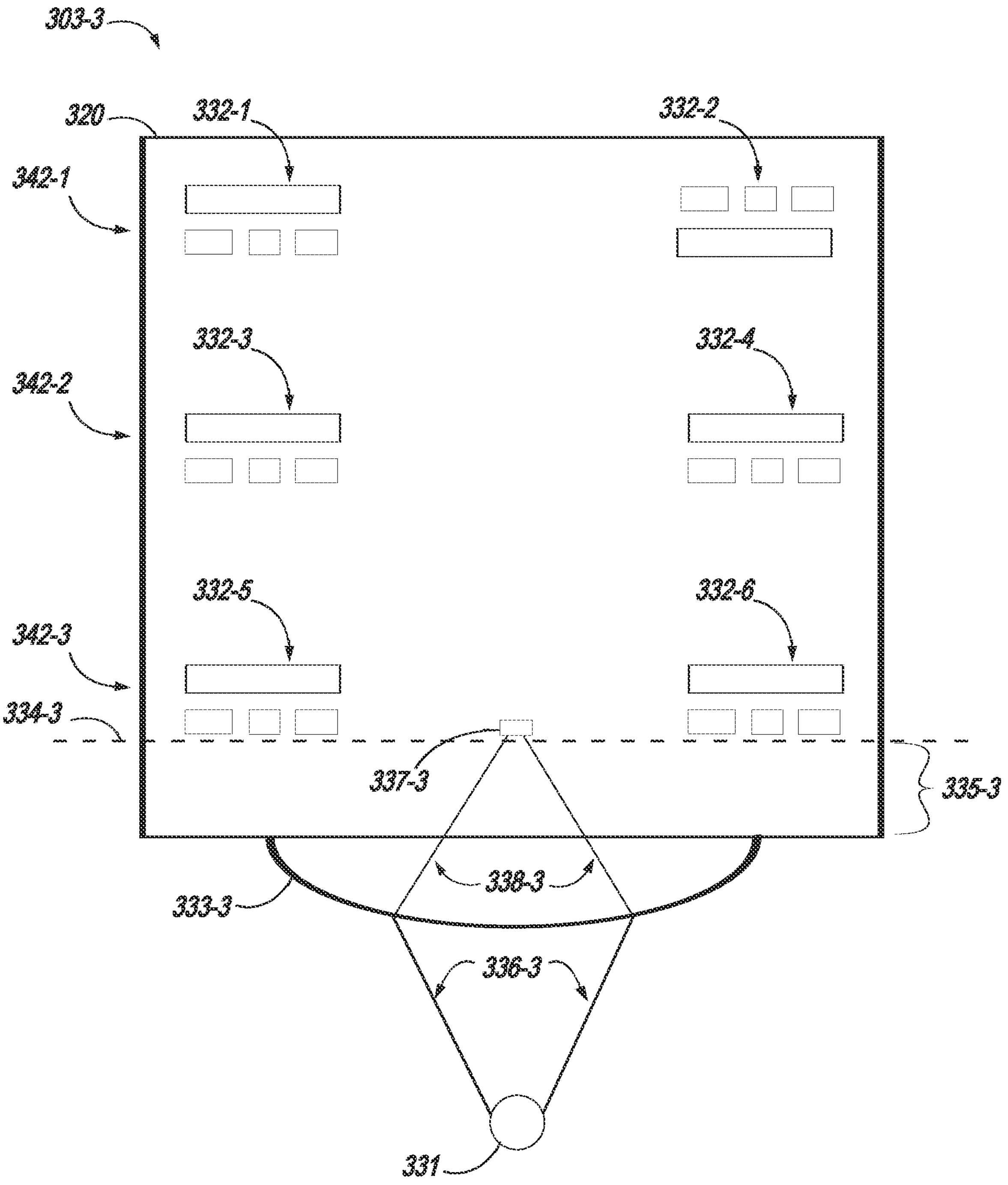

FIGS. 3A-3C each illustrate an example system for performing electro-optical probing of a multi-die stack in accordance with some embodiments of the present disclosure. FIG. 3A illustrates performing on EOP operation on a diode/transistor 337-1 at a first depth 334-1 into the multi-die stack of the memory device 320. The memory device 320 can include a plurality of memory dies 332-1, 332-2, 332-3, 332-4, 332-5, 332-6 (hereinafter referred to as plurality of memory dies 332). The memory dies 332-1 and 332-2 are in a first row 342-1 at a first particular distance 335-1 from an outside of the memory device 320 that is in contact with a lens 333-1. The memory dies 332-3 and 332-4 are in a second row 342-2 at a second depth. The memory dies 332-5 and 332-6 are in a third row 342-3 at a third depth. Each of the plurality of memory dies 332 include a plurality of metallization layers (as illustrated by multiple boxes). The first row 342-1 is the further distance from outside of the memory device 320, the second row 342-2 is closer than the first row 342-1 but further away than the third row 342-3 from the outside of the memory device 320.

A light source 331 can transmit light 336-1 through a lens 333-1. The light 338-1 transmitted through the lens 336-1 can be directed at the diode/transistor 337-1 and be reflected back to a sensor (e.g., such as sensor 228 in FIG. 2). The lens 336-1 can be a first fixed focal length that correlates to the distance 335-1 and specifically focuses the light 336-1 to the location 334-1 of the diode/transistor 337-1.

As illustrated in FIG. 3A, a devoid area 300-1 can provide for transmission of the light 338-1 past the second 342-2 and third 342-3 rows of memory dies 332-3, 332-4, 332-5, 332-6. The devoid area 300-1 can be created by routing metallization layers of the memory dies 332 of the second 342-2 and third 342-3 rows.

FIG. 3B illustrates performing an EOP operation on a diode/transistor 337-2 at a second depth 334-2 into the multi-die stack of the memory device 320. The memory dies 332-3 and 332-4 are in a second row 342-2 at a second depth 334-2. Each of the plurality of memory dies 332 include a plurality of metallization layers (as illustrated by multiple boxes). A light source 331 can transmit light 336-2 through a lens 333-2. The light 338-2 transmitted through the lens 336-2 can be directed at the diode/transistor 337-2 and be reflected back to a sensor (e.g., such as sensor 228 in FIG. 2). The lens 336-2 can be a second fixed focal length that correlates to the distance 335-2 and specifically focuses the light 336-2 to the location 334-2 of the diode/transistor 337-2. As illustrated in FIG. 3A, a devoid area 300-2 can provide for transmission of the light 338-2 past the third 342-3 row of memory dies 332-5, 332-6. The devoid area 300-2 can be created by routing metallization layers of the memory dies 332 of the third 342-3 row. While the diode/transistor 337-2 is illustrated as being in the center of the metallization layers of the memory dies 332, the diode/transistor 337-2 can be moved to either the right or left in order to make space for light to transfer through to the first row 342-1.

FIG. 3C illustrates performing an EOP operation on a diode/transistor 337-3 at a second depth 334-3 into the multi-die stack of the memory device 320. The memory dies 332-5 and 332-6 are in a third row 342-3 at a third depth 334-3. Each of the plurality of memory dies 332 include a plurality of metallization layers (as illustrated by multiple boxes). A light source 331 can transmit light 336-3 through a lens 333-3. The light 338-3 transmitted through the lens 336-3 can be directed at the diode/transistor 337-3 and be reflected back to a sensor (e.g., such as sensor 228 in FIG. 2). The lens 336-3 can be a third fixed focal length that correlates to the distance 335-3 and specifically focuses the light 336-3 to the location 334-3 of the diode/transistor 337-3. While the diode/transistor 337-3 is illustrated as being in the center of the metallization layers of the memory dies 332, the diode/transistor 337-3 can be moved to either the right or left in order to make space for light to transfer through to the first row 342-1 and/or second row 342-2.

Figure 4:
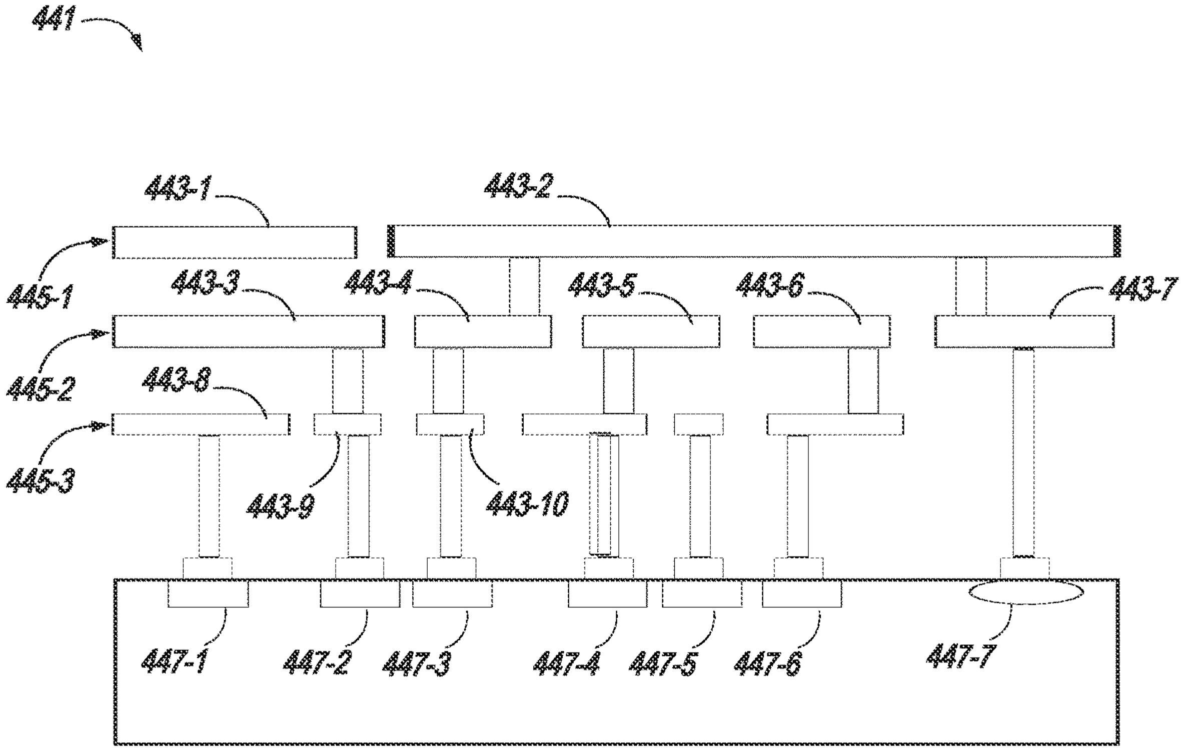
FIG. 4 illustrates an example system for performing electro-optical probing of a memory stack in accordance with some embodiments of the present disclosure.

FIG. 4 illustrates an example system 441 for performing electro-optical probing of a memory stack in accordance with some embodiments of the present disclosure. In one example, the memory stack can include a multi-die stack. In one example, the memory stack can include a non-multi-die stack. The system 441 includes a number of rows 445-1, 445-2, 445-3 of metallization layers 443-1 to 443-10 and a plurality of transistors 447-1 to 447-6 and a transistor/diode 447-7. As is described herein, an outer diode/transistor 447-7 can be coupled to a target drain of the transistor generating the signal of interest (e.g., in one example, transistor 447-3) to use the outer diode/transistor 447-7 to perform the EOP operation to avoid interference from neighboring transistors, such as transistors 447-2, 447-4, and so forth. In some examples, the transistor 447-7 can be a diode, a gate of a transistor, or a drain of a transistor.

For example, the target drain of a transistor generating the signal of interest (e.g., in one example, transistor 447-3) can be coupled through metallization layer 443-10, 443-4, 443-2, and 443-7 to the outer diode/transistor 447-7. In response to a signal being generated by the transistor 447-3, the same signal can travel through or to diode/transistor 447-7. Therefore, the EOP operation can be performed on the outer diode/transistor 447-7 to analyze the signal of the target transistor 447-3. The outer diode/transistor 447-7 can be a particular distance from transistor 447-6 in order to avoid interference from that transistor 447-6 as well. In some examples, the signal of interest can be connected, far enough away from the main logical circuit, with the drain of a transistor, the gate of a transistor, or a diode. If the EOP operation was used on the target transistor 447-3 directly, an incoherent reflection of light used by EOP may cover multiple transistors or part of multiple transistors and, in this approach, be difficult to determine the signal behavior or the transistor generating the signal of interest.

Figure 5:
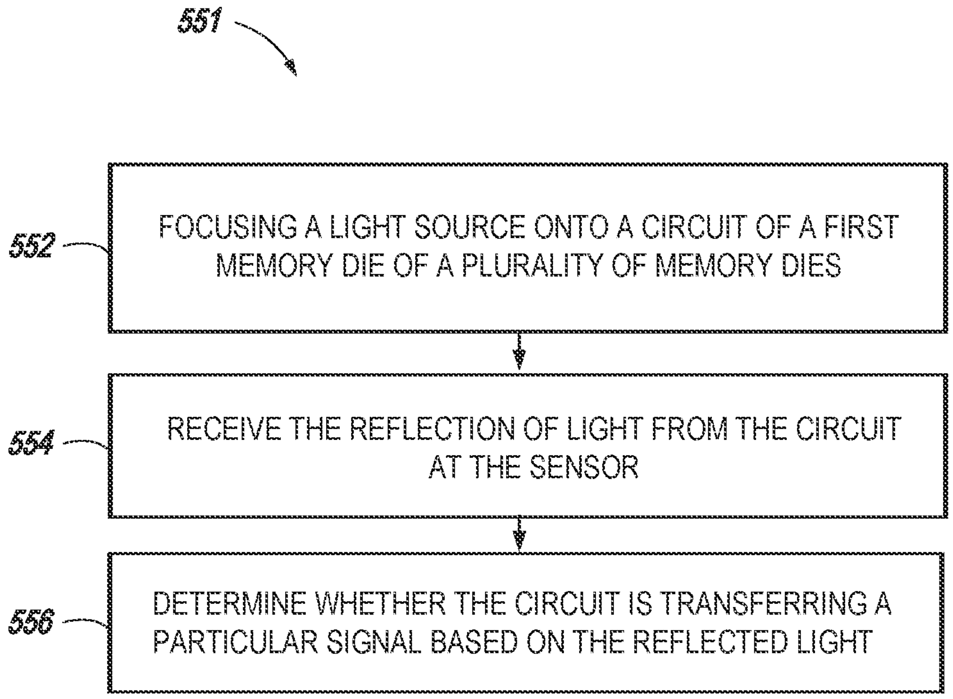
FIG. 5 is a flow diagram of an example method corresponding to electro-optical probing in accordance with some embodiments of the present disclosure.

FIG. 5 is a flow diagram of an example method 551 corresponding to electro-optical probing in accordance with some embodiments of the present disclosure. The method 551 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 551 is performed by the signal component 113 and/or EOP component 115 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 552, the method 551 can include focusing a light source onto a circuit of a first memory die of a plurality of memory dies. A light of the light source can reach the circuit of the memory die and can be reflected back toward a sensor. In some examples, the light source is a high intensity light (HIL) source. In some examples, a light of the light source passes by a second memory die of the plurality of memory dies to reach the circuit of the memory die. In some examples, a distance between the circuit and the outside surface is correlated with a particular size lens and the particular size lens focuses the light source.

In some examples, each of the plurality of memory dies comprise a plurality of metallization layers. In some examples, the light passes through an area devoid of metallization layers in the second memory die. The devoid area can be created by positioning a plurality of metallization layers of the plurality of memory dies such that the light passes through the second memory die. In some examples, a first diode of the plurality of diodes is coupled via at least one of the plurality of metallization layers to a second diode of the plurality of diodes such that the second diode is a particular distance from any of the plurality of diodes. In some examples, a plurality of diodes are coupled to the plurality of metallization layers. In some examples, a first diode of the plurality of diodes is coupled via at least one of the plurality of metallization layers to a second diode of the plurality of diodes such that the second diode is a particular distance from any of the plurality of diodes. The particular distance can be within a range of 150 nanometers and 250 nanometers.

At block 554, the method 551 can include receiving the reflection of light from the circuit at the sensor. The reflection of light can be an indication of a status of the circuit. The reflection of the light can be analyzed and used to determine whether the circuit if functioning properly. The reflected light can be used to determine whether at least one, several, or all, of the transistors associated with the circuit are functioning properly.

At block 556, the method 551 can include determining whether the circuit is transferring a particular signal based on the reflected light. In response to the particular signal being different than an expected signal or a signal associated with a functioning circuitry and/or transistors, additional signals can be sent and/or transferred using additional EOP operations in order to continue to test and/or determine whether there is an error occurring. A feedback loop of signals, reflected light, and analysis of the reflected light can be used to determine a particular of the problem and/or error occurring.

Figure 6:
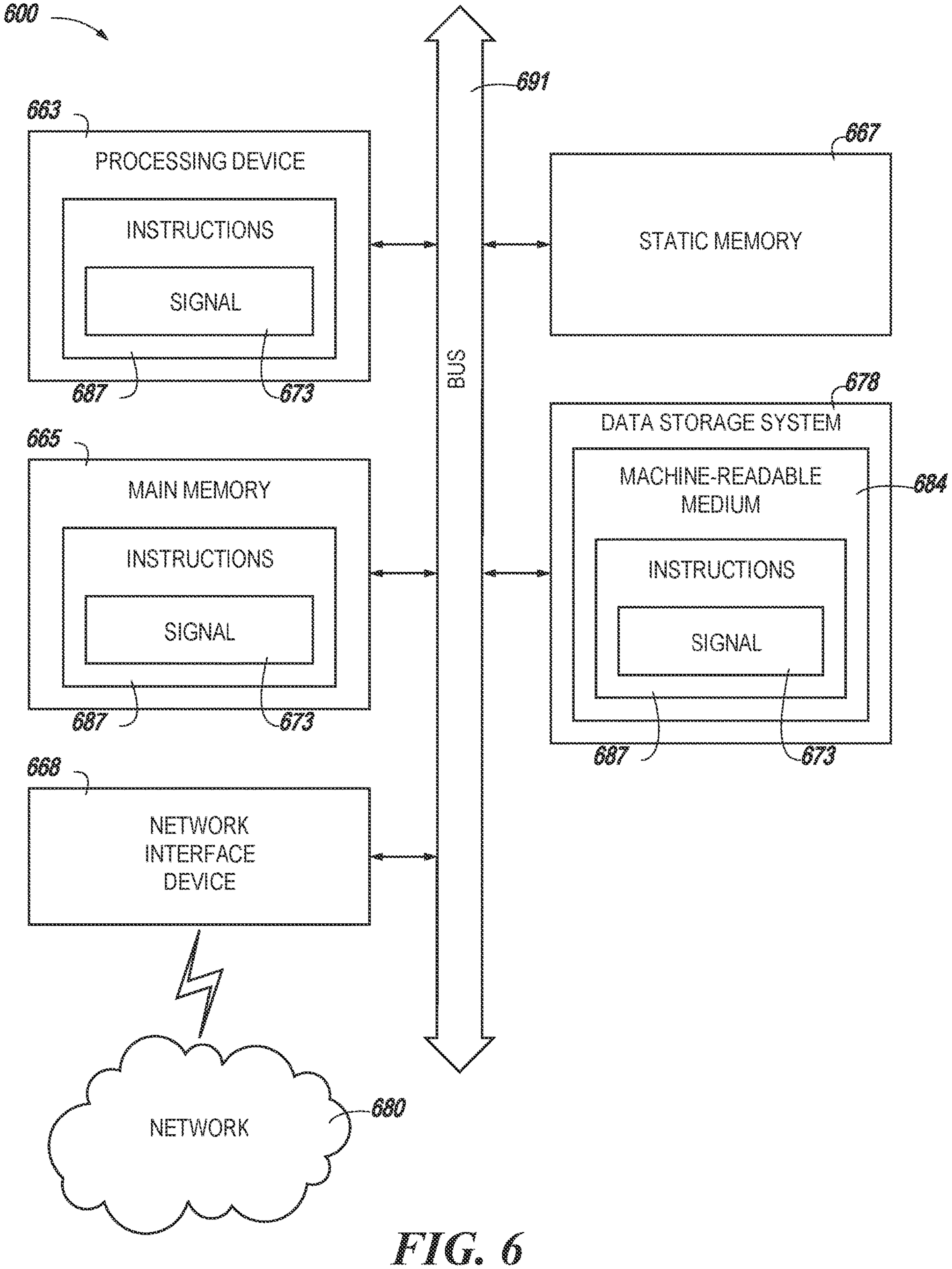
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to adjust a parameter associated with programming a memory cell, such as a window adjustment component 113). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 663, a main memory 665 (e.g., read-only memory (ROM), flash memory, dynamic random access memory (DRAM) such as synchronous DRAM (SDRAM) or Rambus DRAM (RDRAM), etc.), a static memory 667 (e.g., flash memory, static random access memory (SRAM), etc.), and a data storage system 678, which communicate with each other via a bus 691.

Processing device 663 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 663 can also be one or more special-purpose processing devices such as an application specific integrated circuit (ASIC), a field programmable gate array (FPGA), a digital signal processor (DSP), network processor, or the like. The processing device 663 is configured to execute instructions 687 for performing the adjustment operations using a window adjustment component 673 (including adjusting a voltage window previously described) and steps discussed herein. The computer system 600 can further include a network interface device 668 to communicate over the network 680.

The data storage system 678 can include a machine-readable storage medium 684 (also known as a computer-readable medium) on which is stored one or more sets of instructions 687 or software embodying any one or more of the methodologies or functions described herein. The instructions 687 can also reside, completely or at least partially, within the main memory 665 and/or within the processing device 663 during execution thereof by the computer system 600, the main memory 665 and the processing device 663 also constituting machine-readable storage media. The machine-readable storage medium 684, data storage system 678, and/or main memory 665 can correspond to the memory sub-system 104 of FIG. 1.

In one embodiment, the instructions 687 include instructions to implement functionality corresponding to adjustment of a voltage window (e.g., window adjustment component 113 of FIG. 1). While the machine-readable storage medium 684 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
- a plurality of memory dies arranged in a stack, the plurality of memory dies each including a group of memory cells;
- wherein:
  - each of the plurality of memory dies comprise a plurality of metallization layers; and
  - at least two of the plurality of memory dies comprise an area within their respective plurality of metallization layers that is devoid of metal, wherein the areas devoid of metal are vertically aligned such that light can travel through the areas devoid of metal and reach a circuit.

2. The apparatus of claim 1, wherein the circuit is positioned opposite an outside surface of the stack and the areas devoid of metal of the at least two of the plurality of memory dies are between the circuit and the outside surface.

3. The apparatus of claim 2, wherein a distance between the circuit and the outside surface is correlated with a particular size lens.

4. The apparatus of claim 3, wherein the particular size lens is configured to focus a light source onto the circuit.

5. The apparatus of claim 4, wherein the light source is a high intensity light (HIL) source.

6. The apparatus of claim 3, wherein the particular size lens is a solid immersion lens (SIL).

7. An apparatus, comprising:
- a plurality of memory dies arranged in a stack, the plurality of memory dies each including a group of memory cells;
- wherein:
  - each of the plurality of memory dies comprise a plurality of metallization layers; and
  - a plurality of diodes of a particular memory die of the plurality of memory dies are coupled to the plurality of metallization layers of the particular memory die;
  - a first diode of the plurality of diodes is coupled via at least one of the plurality of metallization layers to a second diode of the plurality of diodes that is a particular distance from any of the plurality of diodes such that electro-optical probing of the second diode can be performed by focusing a light source through two or more memory dies of the plurality of memory dies while avoiding interference from other transistors of the plurality of transistors; and
  - the light is focused through an area of the two or more memory dies where the metallization layers of the two or more memory dies are devoid of metal.

8. The apparatus of claim 7, wherein the second diode is configurable to be deactivated while the first diode is enabled.

9. The apparatus of claim 7, wherein a first signal transferred through the first diode occurs simultaneous with a second signal transferred through the second diode.

10. The apparatus of claim 7, wherein the particular distance is greater than 200 nanometers.

11. A method, comprising:
- focusing a light source onto a circuit of a first memory die of a plurality of memory dies, each memory die of the plurality of memory dies having a plurality of metallization layers, wherein a light of the light source is transmitted through two or more memory dies of the plurality of memory dies to reach the circuit of the first memory die and is reflected back toward a sensor, wherein the metallization layers of the two or more memory dies each have an area devoid of metal and the areas devoid of metal are vertically aligned such that the light can pass through the areas devoid of metal to reach the circuit of the first memory die;
- receiving the reflection of light from the circuit at the sensor; and
- determining whether the circuit is transferring a particular signal based on the reflected light.

12. The method of claim 11, wherein the light source is a high intensity light (HIL) source.

13. The method of claim 11, wherein a distance between the circuit and the outside surface is correlated with a particular size lens and the particular size lens focuses the light source.

14. The method of claim 11, wherein a plurality of diodes are coupled to the plurality of metallization layers of the first memory die.

15. The method of claim 14, wherein a first diode of the plurality of diodes is coupled via at least one of the plurality of metallization layers to a second diode of the plurality of diodes such that the second diode is a particular distance from any of the plurality of diodes.

16. The method of claim 15, wherein the particular distance is within a range of 150 nanometers and 250 nanometers.

* * * * *